United States Patent [19]
Nakaya et al.

[11] Patent Number: 6,118,212
[45] Date of Patent: Sep. 12, 2000

[54] ORGANIC ELECTROLUMINESCENT LIGHT EMITTING DEVICES

[75] Inventors: Kenji Nakaya, Chiba; Isamu Kobori, Ibaraki; Masami Mori, Yamanashi; Kazutoshi Ohisa, Ibaraki; Michio Arai, Tokyo, all of Japan

[73] Assignee: TDK Corporation, Tokyo, Japan

[21] Appl. No.: 09/079,286

[22] Filed: May 15, 1998

[30] Foreign Application Priority Data

May 20, 1997 [JP] Japan ................................ 9-145808

[51] Int. Cl.⁷ .................................................. H05B 33/26
[52] U.S. Cl. ......................... 313/503; 313/506; 428/917
[58] Field of Search ................................. 313/336, 503, 313/506, 509; 428/917

[56] References Cited

U.S. PATENT DOCUMENTS

| | | | |
|---|---|---|---|
| 3,173,050 | 3/1965 | Gurnee . | |
| 3,382,394 | 5/1968 | Mehl . | |
| 4,207,488 | 6/1980 | Aboelfotoh | 313/221 |
| 4,770,950 | 9/1988 | Ohmishi | 313/503 |
| 4,885,211 | 12/1989 | Tang et al. . | |
| 5,273,474 | 12/1993 | Oshima et al. | 445/7 |
| 5,429,884 | 7/1995 | Namiki et al. | 313/503 |
| 5,578,864 | 11/1996 | Ochi et al. | 257/467 |

FOREIGN PATENT DOCUMENTS

| | | |
|---|---|---|
| 0 876 086 | 11/1998 | European Pat. Off. . |
| 0 880 205 | 11/1998 | European Pat. Off. . |
| 60-165771 | 8/1985 | Japan . |
| 2-15595 | 1/1990 | Japan . |
| 4-212287 | 8/1992 | Japan . |
| 5-121172 | 5/1993 | Japan . |
| 5-159882 | 6/1993 | Japan . |
| 9-283281 | 10/1997 | Japan . |
| 10-106752 | 4/1998 | Japan . |

*Primary Examiner*—Ashok Patel
*Attorney, Agent, or Firm*—Oblon, Spivak, McClelland, Maier & Neustadt, P.C.

[57] ABSTRACT

An organic EL device of the invention comprises a hole injecting electrode, an electron injecting electrode and at least one organic layer interleaved between them. The electron injecting electrode is a film of an aluminum lithium alloy formed by a sputtering technique and comprising 0.4 to 14 at % of lithium. The electron injecting electrode further includes on a side of the electron injecting electrode that is not opposite to the organic layer a protective electrode comprising at least one of aluminum, aluminum and a transition metal except titanium, titanium, and titanium nitride.

12 Claims, 1 Drawing Sheet

ORGANIC ELECTROLUMINESCENT LIGHT EMITTING DEVICES

TECHNICAL FIELD

The present invention relates generally to an organic electroluminescent light emitting device (which will hereinafter be often called an organic EL device for short), and more particularly to improvements in or relating to an electron injecting electrode for supplying electrons to an light emitting layer, and a protective electrode as well.

BACKGROUND TECHNIQUE

In recent years, organic EL devices have been under intensive investigation. One such organic EL device basically includes a transparent electrode (a hole injecting electrode) of tin-doped indium oxide (ITO), etc. A thin film is formed on the transparent electrode by evaporating a hole transporting material such as triphenyldiamine (TPD). A light emitting layer of a fluorescent material such as an aluminum quinolinol complex ($Alq^3$) is deposited on the hole transporting thin film. An electrode (an electron injecting electrode) is formed thereon from a metal having a low work function such as magnesium or Mg. This organic EL device attracts attentions because it can achieve a very high luminance ranging from several hundreds to tens of thousands $cd/m^2$ with a voltage of approximately 10 volts.

An electron injecting electrode considered to be effective for such organic EL devices is made up of a material capable of injecting more electrons into the light emitting layer or electron injecting and transporting layer. In other words, the lower the work function of a material, the more suitable is the material as the electron injecting electrode. Various materials having a low work function are available. Regarding materials used as the electron injecting electrode of organic EL devices, for instance, JP-A 2-15595 discloses an electron injecting electrode material comprising a plurality of metals other than an alkali metal, at least one of which has a work function of less than 4 eV, typically MgAg.

A preferable material having a low work function is an alkali metal. U.S. Pat. Nos. 3,173,050 and 3,382,394 disclose NaK as one example of the alkali metal. However, an electron injecting electrode made up of the alkali metal is inferior to that built up of MgAg, etc. in terms of safety and reliability, because the alkali metal has high activity and so is chemically unstable.

In efforts to increase the stability of electron injecting electrodes using alkali metals, for instance, JP-A's 60-165771, 4-212287, 5-121172 and 5-159882 propose electron injecting electrodes using AlLi alloys. Reference is here made to the concentration of Li in the AlLi alloys disclosed in these publications and their production processes. (1) JP-A 60-165771 teaches that the concentration of Li is in the range of 3.6 to 99.8 at % (1 to 99 wt %) and preferably 29.5 to 79.1 at % (10 to 50 wt %), and the examples given therein show AlLi alloys having an Li content in the range of 15.8 to 79.1 at % (4.8 to 50 wt %). These AlLi alloys are all formed by an evaporation technique. (2) JP-A 4-212287 teaches that the concentration of Li is at least 6 at % and preferably 6 to 30 at %, and the example given therein shows an AlLi alloy having an Li content of 28 at %. Therein, these AlLi alloy films may be formed by resistance heating co-evaporation, electron beam evaporation or sputtering. However, the example refers to an evaporation process alone. (3) JP-A 5-121172 discloses AlLi alloys containing Li at concentrations of 0.0377 to 0.38 at % (0.01 to 0.1:100 by weight), and the examples given therein show that AlLi alloy films containing Li at concentrations of 0.060 to 0.31 at % (0.016 to 0.08:100 by weight) are formed by resistance heating evaporation or electron beam evaporation. Also, the publication discloses that AlLi alloy films having Li contents of up to 15.9 at % (50 or lower:1000 by weight) are formed, and the examples given therein show that AlLi alloy films having Li contents of 29.5 to 61.8 at % (10 to 30 wt %) are formed. (4) JP-A 5-159882 discloses AlLi alloys having Li contents of 5 to 90 at % and the examples given therein show AlLi alloys having Li contents of 16 to 60 at %. Therein, these alloy films are formed by double-evaporation wherein resistance heating evaporation is applied to an Li source while electron beam evaporation is applied to the other.

However, the AlLi alloy electrodes set forth in publications (1), (3) and (4) are all formed by vacuum evaporation alone. Although publication (2) refers to the formation of AlLi alloy electrodes by sputtering, only vacuum evaporation is described in the examples therein. Thus, the examples gives nothing specific about sputtering.

When a vacuum evaporation process is used, an AlLi alloy is employed as an Li evaporation source because lithium is in itself inferior in terms of chemical stability, film-forming capability, and adhesion. Since these metals have varying vapor pressures, however, it is required to rely upon double evaporation (co-evaporation) with Al. A problem with double evaporation is, however, that it is not easy to gain composition control and so it is difficult to obtain the optimum mixing ratio in a stable manner for each batch. Thus, the actually obtainable Li concentration is shifted to a relatively high concentration side of 16 to 79 at %, and cannot be kept invariable. A high Li concentration is a factor in the degradation of devices because the composition is chemically unstable, resulting in deterioration of its film-forming capability and adhesion. In addition, devices having consistent quality cannot be obtained. When evaporation is carried out using a single evaporation source, on the other hand, the concentration of Li drops to 0.38 at % or lower, yielding an alloy having a high work function. This in turn gives rise to an electron injection efficiency drop, and so renders it difficult to obtain devices having practical enough properties.

An electron injecting electrode film formed by a vacuum evaporation process is poor in denseness, and adhesion to an organic layer interface, yielding an organic EL device with a light emission efficiency drop and dark spots produced by the delamination of the electrode. Thus, the obtained EL device offers problems in connection with its properties and service life, and the quality of what is displayed on it.

A material having a low work function, like Li, is usually formed thereon with an oxide layer, because the material is of high reactivity with respect to oxygen or moisture, and is usually handled in the atmosphere for feed, and supply purposes. To form an electron injecting electrode of high quality, it is desired to carry out evaporation after removal of the oxide layer form the surface of the material. However, this is difficult because, in a rare case alone, the oxide has a lower evaporation temperature or a higher vapor pressure than does a pure metal. It is thus not easy to form a high-quality electron injecting electrode consisting of a pure metal film. In addition, when a film obtained from such an oxide material by evaporation is formed on the interface between the electron injecting electrode and the organic layer or within the electrode, the resulting work function and electrical conductivity deviate from those of the pure metal. It is thus impossible to obtain any desired EL properties. From a practical perspective, the vacuum evaporation process have various productivity problems, among which it is required to make a material replacement or addition within a short time of period, a film having a large area is inconsistent in terms of composition control, film thickness and film quality, and consistent composition control, film quality reproducibility and consistent film quality are not obtained at an increased film forming rate.

An alloy electron injecting electrode is much more stable than that composed of Li alone. Upon direct exposure to air or moisture, however, the alloy electrode oxidizes and corrodes. This in turn causes a reduction in the service life of the device due to the occurrence of dark spots and a reduction in the half life of luminance. In an effort to avoid this, a sealing film formed of silicon or Teflon is provided to shield the electron injecting electrode from the outside. Even with such a sealing film, however, no satisfactory results are still obtained. There is thus a strong demand for an organic EL device that is less likely to develop dark spots and has an ever longer half life of luminance and an ever longer service life.

In some efforts, an organic EL device is applied to a dot matrix type of flat panel display such as an LCD. The flat panel display, to which the organic EL device is applicable, is generally broken down into two types, a simple matrix drive type wherein an organic EL device structure is located between an cathode interconnection and an anode interconnection crossing over each other, and an active matrix drive type where a TFT (thin film transistor) or other switching element is provided per pixel.

Whether the flat panel display is of the simple matrix type or the active matrix type, a given interconnecting material has so far been formed as by a sputtering technique according to a given pattern. When it is intended to form a large screen yet high precision display, however, the use of an interconnecting material having high specific resistance gives rise to a light emission luminance drop due to a voltage drop at an interconnecting electrode, which may otherwise result in a so-called luminance variation that causes a light emission luminance variation on the same screen. To achieve a high speed display of high responsibility, it is an important object to prevent signal delays by lowering the resistance of the interconnecting electrode. For a high precision display having a large screen of 2 to 3 inches or greater, for instance, an interconnecting electrode is required to have low-enough thin film specific resistance.

The organic EL device gives out light during the passage of a current from the anode to the cathode in the forward direction, and so may be regarded as a sort of light emitting diode. Thus, the organic EL device has a so-called diode property of making the backward passage of the current unlikely. This diode property is of great importance to the simple matrix type; a current (leakage current) passing in the backward direction does not only incur degradation of the quality of what is displayed such as crosstalks and luminance variations, but also brings about consumption of energy making no contribution to light emission such as unnecessary generation of heat from the device, leading to considerable light emission efficiency drops. It is thus required to reduce the current (leakage current) in the backward direction as much as possible.

SUMMARY OF THE INVENTION

It is therefore an object of the invention to achieve an organic EL device which comprises an electron injecting electrode that is well protected against an external environment, and improved in terms of its ability to form film at its interface with an organic layer and its adhesion to the organic layer, thereby ensuring that the organic EL device is substantially free of dark spots and has ever higher efficiency, an ever longer half life of luminance and an ever longer service life, and so can display high quality images.

Another object of the invention is to achieve an organic EL device comprising an electron injecting electrode which is improved in terms of its ability to form film at its interface with an organic layer, its adhesion to the organic layer and its film physical properties, thereby ensuring that the organic EL device has ever higher luminance and efficiency, and so can display high quality images.

Yet another object of the invention is to achieve an organic EL device which comprises an electron injecting electrode having film interface physical properties depending on the functions of its organic layer side surface and the opposite side surface, and which has ever higher luminance and efficiency and an ever longer service life and is insusceptible to oxidation and corrosion, and so can display high quality images.

A further object of the invention is to achieve an organic EL display which comprises an interconnecting electrode of low resistance, and can be operated at high speed with a reduced power to display high precision images.

A still further object of the invention is to achieve an organic EL device which can reduce a current (leakage current) in the backward direction as much as possible, and so can display high quality images with neither crosstalks nor luminance variations.

Such objects are achieved by the inventions defined below as (1) to (9).

(1) An organic EL device comprising a hole injecting electrode, an electron injecting electrode and at least one organic layer interleaved between said electrodes, wherein:
  said electron injecting electrode is a film of an aluminum lithium alloy formed by a sputtering technique and comprising 0.4 to 14 at % of lithium, and
  said electron injecting electrode includes on a side thereof that is opposite to said organic layer a protective electrode comprising at least one of aluminum, aluminum and a transition metal except titanium, titanium, and titanium nitride.

(2) An organic EL device comprising a hole injecting electrode, an electron injecting electrode and at least one organic layer interleaved between said electrodes, wherein:
  said electron injecting electrode is a film of an aluminum lithium alloy formed by a sputtering technique and comprising 0.1 to 20 at % of lithium,
  said electron injecting electrode includes on a side thereof that is opposite to said organic layer a protective electrode comprising at least one of aluminum, aluminum and a transition metal except titanium, titanium, and titanium nitride, and
  said electron injecting electrode further includes as a subordinate component at least one of copper, magnesium, and zirconium in an amount of
  copper: $\leq 10$ wt %
  magnesium: $\leq 5$ wt %
  zirconium: $\leq 0.5$ wt %
per a total amount thereof.

(3) An organic EL device comprising a hole injecting electrode, an electron injecting electrode and at least one organic layer interleaved between said electrodes, wherein:
  said electron injecting electrode is a film of an aluminum lithium alloy formed by a sputtering technique and comprising 0.1 to 20 at % of lithium, and said electron injecting electrode has a concentration gradient in such a thickness-wise direction that a large proportion of lithium is present on a side thereof contiguous to said organic layer and a small proportion of lithium is present on a side thereof contiguous to a protective electrode.

(4) The organic EL device of (3), which further includes a protective electrode on a side of said electron injecting electrode that is not opposite to said organic layer.

(5) The organic EL device of (4), wherein said protective electrode contains at least one of aluminum, aluminum and a transition metal except titanium, titanium, and titanium nitride.

(6) The organic EL device of any one of (2) to (5), wherein said electron injecting electrode contains 0.4 to 14 at % of lithium.

(7) The organic EL device of any one of (1) to (6), wherein said electron injecting electrode contains lithium in an amount of 0.4 at $\% \leq Li < 6.5$ at %.

(8) The organic EL device of any one of (1) to (6), wherein said electron injecting electrode contains 6.5 to 14 at % of lithium.

(9) The organic EL device of any one of (1) to (8), wherein said protective electrode is formed of aluminum or aluminum and a transition metal, and functions as an interconnecting electrode.

It is here to be noted that JP-A 5-121172 discloses the lamination of an Al thin film on an AlLi alloy thin film. However, this multilayer structure is chemically unstable as can be seen from Table 1, given therein, showing that the first metal or lithium is used in large amounts of 29.5 to 61.8 at % (10 to 30 wt %). The publication says nothing specific about illustrative composition, and refers only to evaporation as a film forming process as well. Thus, what is disclosed therein is different from the electron injecting electrode and protective electrode of the present invention.

BRIEF DESCRIPTION OF THE DRAWINGS

The above and other objects, features, and advantages of the invention will be better understood from the following description taken in conjunction with the accompanying drawing.

DETAILED DESCRIPTION OF THE INVENTION

Figure 1:
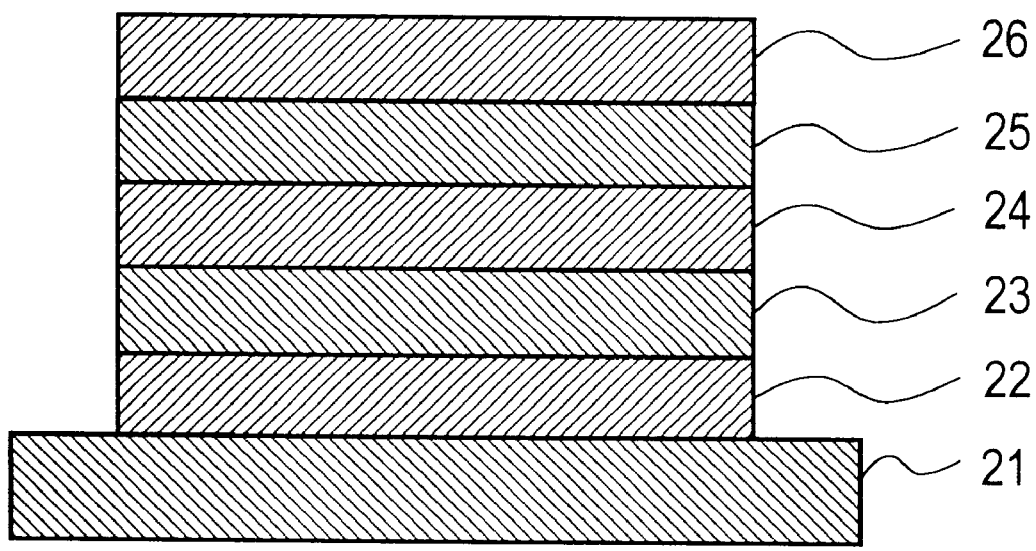
FIG. 1 is a general schematic illustrative of one exemplary embodiment of the organic EL device according to the invention.

Some preferred embodiments of the invention will now be explained at great length.

The organic EL device of the invention comprises a hole injecting electrode, an electron injecting electrode and at least one organic layer interleaved between said electrodes, wherein:

said electron injecting electrode is a film of an aluminum lithium alloy formed by a sputtering technique, and said aluminum lithium alloy (hereinafter AlLi alloy for short) comprising 0.1 to 20 at %, especially 0.4 to 14 at % of lithium or Li. The organic EL device of the invention further comprises on a side of said electron injecting electrode that is not opposite to said organic layer a protective electrode containing aluminum; aluminum and a transition metal except titanium; titanium; and titanium nitride. It is here to be noted that the organic EL device of the invention may, or may not, have this protective electrode when the electron injecting electrode has such a concentration gradient as defined later.

In the electron injecting electrode film formed by the sputtering technique, the atoms or atom groups upon sputtering have a kinetic energy relatively higher than would be obtained with the evaporation technique, so that the adhesion of the electron injecting electrode film to the organic layer at their interface is improved due to a surface migration effect. In addition, an oxide layer is removed in vacuum from the surface of the electrode by pre-sputtering or moisture or oxygen is removed from the organic layer interface, on which they are adsorbed, by reverse sputtering to form a clean electrode-organic layer interface or a clean electrode, so that consistent organic EL devices of high quality can be produced. For the target, the AlLi alloys having the aforesaid composition range, pure Al, and pure Li may be used alone or in combination with an additional target comprising the subordinate component or components or with the addition of the subordinate component or components thereto. It is also acceptable to use a mixture of materials having largely varying vapor pressures as the target, because there is only slight a deviation of the composition of the resultant film from the target composition. There is thus no limitation on the material used with the sputtering technique, whereas there are some limitations such as vapor pressure on the evaporation technique. The sputtering technique is additionally advantageous over the evaporation technique in terms of consistent film thickness and quality as well as productivity, because it is unnecessary to feed the raw material over an extended period of time.

The electron injecting electrode formed by the sputtering technique is a film so very dense that the penetration of moisture into the film is much more reduced as compared with a coarse film prepared by evaporation, and so the chemical stability of the film is much more increased. This ensures the production of organic EL devices having an ever longer service life.

The content of Li in the electron injecting electrode is 0.1 at $\% \leq Li \leq 20$ at %, when copper or Cu, magnesium or Mg, and zirconium or Zr is added thereto or the electron injecting electrode has an Li concentration gradient, as described later. When the electron injecting electrode is composed of AlLi alone, the content of Li is 0.1 at $\% \leq Li \leq 14$ at %. Too little or too much lithium results in an electron injection efficiency drop. Too much lithium makes the stability of the electrode worse. The content of Li in the electron injecting electrode is preferably 0.4 at $\% \leq Li < 6.5$ at %, more preferably 0.4 at $\% \leq Li < 5$ at %, yet more preferably 0.4 at $\% \leq Li \leq 4.5$ at %, yet more preferably 0.4 at $\% \leq Li \leq 4$ at %, and most preferably 0.4 at $\% \leq Li \leq 3$ at %. Alternatively, it is acceptable that preferably 6.5 at $\% \leq Li \leq 14$ at % and more preferably 7 at $\% \leq Li \leq 12$ at %. When the amount of the element Li is too much, the stability of the electron injecting electrode upon film formation becomes worse. With too little lithium, on the other hand, the advantages of the invention are unachievable. To increase the stability of light emission luminance, it is preferable to use Li at a somewhat higher concentration. To increase the stability of driving voltage, on the contrary, it is preferable to use Li at a somewhat lower concentration.

The AlLi alloy electron injecting electrode used herein has a high rectification factor of the order of $10^4$ to $10^6$ (resistance in the backward direction/resistance in the forward direction). When this electron injecting electrode is used with a simple matrix type display having about $10^4$ to $10^6$ pixels, it is thus possible to display images with no crosstalks, because a forward current value at one pixel is larger than the sum of backward current values at all remaining pixels.

The organic EL device of the invention has a protective electrode on the electron injecting electrode, i.e., on the side of the electron injecting electrode that is not opposite to the organic layer. By the provision of the protective electrode, the electron injecting electrode is protected against the air, moisture, etc., so that the degradation of the constituting thin film can be prevented, resulting in the stabilization of electron injection efficiency and an ever greater increase in the service life of the device. The protective electrode has a very low resistance, and so functions as an interconnecting electrode when the electron injecting electrode has a high resistance, as will be described later. The protective electrode may be formed of at least one of Al; Al and a transition metal except Ti; Ti; and titanium nitride or TiN. When these are used alone, the protective electrode preferably contains Al in an amount of about 90 to 100 at %, Ti in an amount of about 90 to 100 at %, and TiN in an amount of about 90 to 100 mol %. Two or more of Al, Ti and TiN may be used at any desired mixing ratio. For instance, a mixture of Al and Ti preferably contains Ti in an amount of up to 10 at %. Alternatively, it is acceptable to laminate together laminae each containing a single species. In particular, favorable results are obtained when Al or Al and a transition metal are used as the interconnecting electrode to be described later. TiN, on the other hand, provides a film having a striking sealing effect because of its good corrosion resistance. For TiN, an about 10% deviation from its stoichiometric composition is acceptable. In addition, Al-transition metal alloys may contain transition metals, especially magnesium or Mg, scandium or Sc, niobium or Nb, zirconium or Zr, hafnium or Hf, neodymium or Nd, tantalum or Ta, copper or Cu, silicon or Si, chromium or Cr, molybdenum or Mo, manganese or Mn, nickel or Ni, palladium or Pd, platinum or Pt and tungsten or W in the total amount of up to 10 at %, especially up to 5 at %, and more especially up to 2 at %. When the protective electrode functions as the interconnecting material to be described later, the thin film resistance becomes lower with a decrease in the content of the transition metal.

Elements capable of forming solid solutions with Al in an equilibrium state are relatively limited. For thin films to be formed by a sputtering technique, however, a selection may be made from a wide range of alloying elements because the formation of non-equilibrium solid solutions ensures alloy films of single-phase structures having a wide range of compositions. The transition metals acting as alloying elements have high activity with respect to oxygen and so contribute to chemically stable passivity. Thus, thin films formed of Al-transition metal alloys by the sputtering technique are effective for corrosion resistance improvements.

For the protective electrode of the invention, it is preferable to use Al, Ti and TiN because chemical stableness and relatively low specific resistance are achievable. However, it is also acceptable to use other electrically conductive inorganic materials. Preferably but not exclusively, a sensible selection is made from materials that ensure the conductivity required for such an interconnecting layer as mentioned above and can give sufficient protection to the cathode and organic layer during the formation of an organic protective layer to be described later, for instance, conductive metals (inclusive of alloys and intermetallic compounds) and conductive ceramics. Preferably, such conductive inorganic materials include any one of silver or Ag, gold or Au, Cr, Mo, Pt and W or alloys thereof, or zinc oxide or ZnO, tin oxide or SnO, and indium oxide or $In_2O_3$, or mixtures thereof. In this case, the alloys may be used at any desired mixing ratio.

The protective electrode of the invention may function as an interconnecting electrode. In other words, this electrode may be used when the film resistance of the electron injecting electrode is low or when the electron injecting electrode has a film thickness that gives only a minimum electron injecting function thereto. Alternatively, the protective electrode is used as an interconnecting electrode in a simple matrix type display, so that any luminance variation can be prevented with a reduction in the voltage drop. Furthermore, when the protective electrode is applied to an active matrix type display using TFTs and so on, fast operation is achieved. The protective electrode laminated on the electron injecting electrode may be used as an interconnecting electrode for attaining low resistance. In this case, such a protective electrode may be provided thereon with a given pattern of interconnecting electrode.

When the film resistance of the electron injecting electrode exceeds usually 0.2 $\Omega/\square$, especially 0.5 $\Omega/\square$, it is preferable that the protective electrode of the invention functions as an interconnecting electrode, although depending on display size or protective electrode material. The upper limit on the resistance is usually of the order of several hundred $\Omega/\square$, although not critical. From a thickness perspective, the protective electrode is needed when the electron injecting electrode has a thickness of usually up to 300 nm and especially up to 200 nm, although depending on display size or protective electrode material.

When the protective electrode of the invention functions as an interconnecting electrode, it is desired that the specific resistance be preferably up to 500 $\mu\Omega\cdot cm$, more preferably up to 50 $\mu\Omega\cdot cm$, especially up to 30 $\mu\Omega\cdot cm$, and more especially up to 10 $\mu\Omega\cdot cm$. Preferably but not exclusively, the lower limit on the specific resistance is of the order of 3 to 4 $\mu\Omega\cdot cm$ that is the specific resistance of Al. For the protective having such specific resistance, it is preferable to use Al or an Al-transition metal alloy. In this case, the Al-transition metal alloy has a transition metal content of preferably up to 5 at %, more preferably up to 2 at %, and especially up to 1 at %. It is most preferable to use Al alone.

The protective electrode may have at least a certain thickness enough to make sure of electron injection efficiency and prevent penetration of moisture, oxygen or organic solvents, for instance, of at least 50 nm, preferably at least 100 nm, and especially 100 to 1,000 nm. With too thin a protective electrode layer, neither are the advantages of the invention obtainable, nor is sufficient connection with terminal electrodes obtainable because the ability of the protective electrode to cover steps becomes low. When the protective electrode layer is too thick, on the other hand, the growth rate of dark spots becomes high because of an increase in the stress of the protective electrode layer. It is here to be noted that when the protective electrode functions as an interconnecting electrode, its thickness may be usually of the order of 100 to 500 nm so as to make up for the high film resistance of the electron injecting electrode due to its thinness, and that when the protective electrode functions as other interconnecting electrode, its thickness may be of the order of 100 to 300 nm.

Preferably but not exclusively, the total thickness of the electron injecting electrode plus the protective electrode is usually of the order of 100 to 1,000 nm.

In the practice of the invention, an organic protective layer may be provided on the protective electrode. The organic protective layer may be a fluorine type of organic polymer thin film containing chlorine, which may be formed by a sputtering process using as an evaporation source at least one polymer selected from carbon fluoride polymers containing chlorine or by a sputtering process using said at least one polymer as a target. Homopolymers or copolymers of chlorine-containing carbon fluoride compounds are preferable for the aforesaid carbon fluoride polymers used as the evaporation source or target. For the aforesaid homopolymers and copolymers, preference is given to chlorotrifluoroethylene homopolymers, dichlorodifluoroethylene homopolymers, and copolymers of chlorotrifluoroethylene and dichlorodifluoroethylene with the chlorotrifluoroethylene homopolymers being most preferable. Besides these homopolymers and copolymers, it is also acceptable to use copolymers of tetrafluoroethylene and chlorotrifluoroethylene or dichlorodifluoroethylene. Each of these polymers has a molecular weight of preferably at least 400, more preferably 1,000 to 600,000 inclusive, and yet more preferably 10,000 to 500,000 inclusive. It is here to be noted that the copolymer may be used at any desired copolymerization ratio. Referring to a copolymer of chlorotrifluoroethylene and dichlorodifluoroethylene for instance, the chlorotrifluoroethylene:dichlorodifluoroethylene ratio is preferably 2:1 to 10:1.

The organic protective layer formed by evaporation or sputtering is constructed of much the same polymer as the evaporation source or target.

The organic protective layer has a thickness of preferably 10 nm to 100 $\mu$m, and more preferably 50 nm to 10 $\mu$m. Too thin an organic protective layer fails to give a sufficient sealing effect, while too thick an organic protective layer results in an increase in the growth rate of dark spots because of its increased stress.

It is here to be noted that the organic protective layer may be built up of a plurality of layers using different targets or evaporation sources. The protective layer may include, in addition to the protective electrode and organic protective layer, a non-fluorine type organic material layer or a non-conductive inorganic material layer between them.

The electron injecting electrode formed may have a concentration gradient structure wherein the concentration of Li varies in such a thickness-wise direction that a good many of Li elements are present on the interface between the electrode and the organic layer while a good many of Al elements are present on the opposite surface. By imparting such a concentration gradient to the electron injecting electrode, Li elements having a low work function can be shifted at a high concentration to the electrode-organic layer interface that is required to have a function of injecting electrons, while Li elements of high reactivity can be shifted at a low concentration to the opposite surface that is likely to come in contact with the air. It is thus possible to achieve an electron injecting electrode of enhanced stability while high electron injection efficiency is maintained. Preferably in this case, the concentration gradient, Co/Ci, is 0.5 or lower, and especially in the range of $10^{-3}$ to 0.4. Here Co represents the concentration of Li at a site in a section of the electron injecting electrode that is positioned 1/3 inward from the interface between the electron injecting electrode and the protective electrode, and Ci stands for the concentration of Li at a site that is positioned 1/3 inward from the interface between the electron injecting electrode and the organic layer. The concentration gradient may be either continuous or discontinuous. Such a concentration gradient may be identified as by Auger electron spectroscopy while ion etching is being carried out. The aforesaid AlLi alloy, when it has such a concentration gradient, has an average Li concentration of 0.1 to 20 at % and preferably 0.4 to 14 at %. Other more preferable ranges, etc. are the same as mentioned above. It is here to be noted that Ci ranges preferably 14 at % to 100 at %.

To impart an Li concentration gradient across the electron injecting electrode is easily achieved by controlling sputtering pressure, preferably as will be described later. Alternatively, this may be achieved by simultaneously using an AlLi alloy target and an Al metal target while their respective film forming rates are placed under control. Instead of such a continuous concentration gradient, a discontinuous (stepwise) concentration gradient may also be imparted across the electron sputtering electrode in such a way that a film having a varying proportion of the Li element is formed.

In addition to aluminum and lithium, the electron injecting electrode of the invention preferably contains as a subordinate component at least one of Cu, Mg, and Zr in an amount, per the total sum of Al and Li, of
preferably
  Cu: ≦10 wt %
  Mg: ≦5 wt %
  Zr: ≦0.5 wt %
more preferably
  Cu: 0.05 to 10 wt %
  Mg: 0.01 to 5 wt %
  Zr: 0.01 to 0.5 wt %
most preferably
  Cu: 0.1 to 6 wt %
  Mg: 0.1 to 3 wt %
  Zr: 0.01 to 0.5 wt %

The physical properties of the electron injecting electrode thin film is much more improved by the incorporation of any one of Cu, Mg, and Zr therein. Consequently, the adhesion of the electron injecting electrode to the organic layer is much more improved, resulting in an improvement in electron injection efficiency and a decrease in stress distortion, etc. in the film. This in turn contributes to the stabilization of the film, preventing the occurrence of dark spots and, hence, an ever greater increase in the service life of the device. The aforesaid AlLi alloy film, when it contains such subordinate components, has an Li concentration of 0.1 to 20 at %, and preferably 0.4 to 14 at %. Other more preferable ranges, etc. are the same as mentioned above. In this case, too, the AlLi alloy film may have such an Li concentration gradient as mentioned above.

The subordinate component or components may be added to the electron injecting electrode by using a target of the subordinate metal element or elements in combination with the aforesaid AlLi target or carrying out sputtering with chips of the subordinate metal element or elements placed on the AlLi target. However, if the ease, with which the composition of the electron injecting electrode to be formed is stabilized to regulate the content or contents of the subordinate component or components within the aforesaid range, is taken into account, it is then preferable to use a mixed target of AlLi with the subordinate component element or elements. Preferably, such a target is obtained by an atmospheric melting process. That is, the raw material is melted in a non-oxidizing atmosphere to obtain a mixed melt. Then, the mixed melt is cooled in a non-aqueous solvent such as ethylene glycol, hot rolled, and latched or otherwise machined to obtain a desired target shape. Besides, use may be made of rapidly solidified powder alloys, composite materials, mechanically alloyed powders, etc. The target is permitted to have a microstructure by the addition of at least one of Cu, Mg, and Zr thereto, thereby preventing abnormal discharge. In addition to these subordinate components, it is also acceptable that the target may contain as additives or inevitable impurities one or two or more of iron or Fe, silicon or Si, oxygen or O, etc., each in an amount of up to 5 wt %.

Preferably, the sputtering gas pressure during sputtering is in the range of 0.1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such Li concentration gradient as defined above.

For the sputtering gas, use is made of inert gases employed with ordinary sputtering systems. For reactive sputtering, reactive gases such as $N_2$, $H_2$, $O_2$, $C_2H_4$ and $NH_3$ may be used in addition to these gases.

In the practice of the invention, it is possible to use an RF sputtering process using an RF power source or the like as the sputtering technique. In view of the ease with which the film forming rate is controlled, and less damage to an organic EL device structure, however, it is preferable to use a DC sputtering process. Power for operating a DC sputtering system is in the range of preferably 0.1 to 10 W/cm$^2$, and especially 0.5 to 7 W/cm$^2$. The film forming rate is preferably in the range of 5 to 100 nm/min. and especially 10 to 50 nm/min.

The electron injecting electrode may have at least a certain thickness enough for the injection of electrons, e.g., of at least 1 nm, and preferably at least 3 nm. Thus, a film thickness of the order of 3 to 500 nm is usually preferable although there is no upper limit thereon.

By making use of such reactive sputtering as mentioned above, the organic EL device of the invention may be provided with a protective electrode comprising a nitride of Ti. In the invention, the nitrogen content of the nitride may deviate more or less from the stoichiometric composition, or they may be 0.5 to 2 times as large as the stoichiometric composition.

When a TiN protective electrode is formed, it is preferable to use Ti for the target. Preferable reactive gases are $N_2$, $NH_3$, NO, $NO_2$, $N_2O$ or the like, and may be used alone or in admixture of two or more. These gases may also used in the form of a mixed gas with an inert gas such as Ar.

The organic EL device produced according to the invention comprises a substrate, a hole injecting electrode formed on the substrate and an electron injecting electrode formed thereon, and further includes at least one charge transporting layer and at least one light emitting layer between these electrodes as well as a protective electrode in the form of the uppermost layer. In this regard, it is to be noted that the charge transporting layer may be dispensed with. In the invention, the electron injecting electrode in a film form is made up of a metal, compound or alloy having a low work function by the sputtering technique as already noted, and the hole injecting electrode in a film form is constructed of tin-doped indium oxide (ITO), zinc-doped indium oxide (IZO), ZnO, $SnO_2$, $In_2O_3$ or the like by the sputtering technique.

A representative embodiment of the organic EL device produced according to the invention is shown in FIG. 1. An EL device as shown in FIG. 1 comprises a substrate 21, and a hole injecting electrode 22, a hole injecting and transporting layer 23, a light emitting and electron injecting/transporting layer 24, an electron injecting electrode 25 and a protective layer 26 formed on the substrate in the described order.

The organic EL device of the invention is not limited to the structures illustrated, and so may have various structures. For instance, the light emitting layer may be provided in a single layer form and between this light emitting layer and the electron injecting electrode there may be interleaved an electron injecting and transporting layer. If required, the hole injecting and transporting layer may be mixed with the light emitting layer.

The electron injecting electrode in a film form may be formed as mentioned above, the light emitting layer and other organic layers in film forms may be formed as by vacuum evaporation, and the hole injecting electrode in a film form may be formed as by evaporation or sputtering. If required, these films can be each patterned by mask evaporation or film formation followed by etching or the like, so that a desired light emitting pattern can be obtained. If the substrate is made up of thin film transistors (TFT), the respective films are then formed according to the TFT pattern for the immediate formation of a display or drive pattern.

In addition to the aforesaid protective electrode, an additional protective film may be formed after the formation of the electrode. The protective film may be formed of either an inorganic material such as $SiO_x$ or an organic material such as Teflon. The protective film may be either transparent or opaque, and has a thickness of the order of 50 to 1,200 nm. The protective film may be formed either by the aforesaid reactive sputtering process or conventional processes such as general sputtering, evaporation or like other processes.

In the practice of the invention, it is preferred to form a sealing layer on the device in order to prevent oxidation of the organic layers and electrodes. The sealing layer for preventing penetration of moisture may be formed by bonding sealing plates such as glass plates with adhesive resin layers of low hygroscopicity such as commercially available sheets of photo-curable adhesives, epoxy adhesives, silicone adhesives, and crosslinking ethylene-vinyl acetate copolymer adhesives. Instead of the glass plates, metal or plastic plates may also be used.

Next, the organic layers provided in the EL device of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the anode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about 1/10 times to about 10 times as large as, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 1 nm, preferably at least 20 nm thick. The upper limit on thickness is usually about 500 nm for the injecting layer and about 500 nm for the transporting layer. The same film thickness applies when two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, for instance, quinacridone, rubrene, and styryl dyes. Use may also be made of quinoline derivatives such as metal complex dyes containing 8-quinolinol or its derivative as ligands, for instance, tris(8-quinolinolato) aluminum, tetraphenylbutadiene, anthracene, perylene, coronene, and 12-phthaloperinone derivatives. Use may further be made of phenyanthracene derivatives disclosed in Japanese Patent Application No. 6-110569, and tetraarylethene derivatives disclosed in Japanese Patent Application 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato) gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis (2-methyl-8-quinolinolato)(2,3-dimethylphenolato) aluminum (III), bis(2-methyl-8-quinolinolato)(2,6-dimethylphenolato)aluminum (III), bis(2-methyl-8-quinolinolato)(3,4-dimethylphenolato) aluminum (III), bis (2-methyl-8-quinolinolato)(3,5-dimethyl-phenolato) aluminum (III), bis(2-methyl-8-quinolinolato)(3,5-di-tert-butylphenolato)aluminum (III), bis(2-methyl-8-quinolinolato)(2,6-diphenylphenolato)aluminum (III), bis (2-methyl-8-quinolinolato)(2,4,6-triphenylphenolato) aluminum (III), bis(2-methyl-8-quinolinolato)(2,3,6-trimethylphenolato)aluminum (III), bis(2-methyl-8-quinolinolato) (2,3,5,6-tetramethylphenolato)aluminum (III), bis(2-methyl-8-quinolinolato)(1-naphtholato) aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato)aluminum (III), bis(2,4-dimethyl-8-quinolinolato) (m-phenylphenolato) aluminum (III), bis(2,4-dimethyl-8-quinolinolato)(3,5-dimethylphenolato)aluminum (III), bis (2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenylphenolato)aluminum (III), bis(2-methyl-5-cyano-8-quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-µ-oxo-bis(2-methyl-8-quinolinolato) aluminum (III), bis(2,4-dimethyl-8-quinolinolato)aluminum (III)-µ-oxo-bis(2,4-dimethyl-8-quinolinolato)aluminum (III), bis(4-ethyl-2-methyl-8-quinolinolato)aluminum (III)-µ-oxo-bis(4-ethyl-2-methyl-8-quinolinolato)aluminum (III), bis(2-methyl-4-methoxyquinolinolato)aluminum (III)-µ-oxo-bis(2-methyl-4-methoxyquinolinolato)aluminum (III), bis(5-cyano-2-methyl-8-quinolinolato)aluminum (III)-µ-oxo-bis(5-cyano-2-methyl-8-quinolinolato)aluminum (III), bis(2-methyl-5-trifluoromethyl-8-quinolinolato)aluminum (III)-µ-oxo-bis (2-methyl-5-trifluoromethyl-8-quinolinolato)aluminum (III), etc.

Other preferable host substances include phenylanthracene derivatives disclosed in Japanese Patent Application No. 6-110569, tetraarylethene derivatives disclosed in Japanese Patent Application No. 6-114456, etc.

In the practice of the invention, the light emitting layer may also serve as an electron injecting and transporting layer. In this case, it is preferable to use tris(8-quinolinolato) aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum (Alq$^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring, as already mentioned.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyldiamine (TPD)), aromatic tertiary amines, hydrazone derivatives, carbozole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed contiguous to the anode (ITO, etc.). It is also preferred to use a compound having good thin film forming ability at the anode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris(8-quinolinolato)aluminum (Alq$^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer as previously mentioned. In this case, it is preferable to use tris(8-quinolilato)aluminum, etc. Like the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the substrate material, transparent or translucent materials such as glass, quartz and resins are used. The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 µm. The use of a thin film having a crystal grain diameter exceeding 0.1 µm results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of up to $10^{-4}$ Pa. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL device of the invention is generally of the DC drive type while it may be of the AC or pulse drive type. The applied voltage is generally of the order of 2 to 20 volts.

EXAMPLE

The present invention are explained more specifically with reference to some examples and comparative examples.

Example 1

A glass substrate having a 100 nm-thick patterned ITO transparent electrode (a hole injecting electrode) prepared by a sputtering process was ultrasonically washed with neutral detergent, acetone, and ethanol, and then pulled up from boiling ethanol, followed by drying. This substrate was cleaned on its surface with UV/$O_3$, and fixed to a substrate holder in a vacuum evaporation system, which was evacuated to a vacuum of $1\times10^{-4}$ Pa or lower. Then, 4,4',4"-tris(-N-(3-methylphenyl)-N-phenylamino)triphenylamine (m-MTDATA) was evaporated at a deposition rate of 0.2 nm/sec. to a thickness of 40 nm to form a hole injecting layer. While the vacuum was maintained, N,N'-diphenyl-N, N'-m-tolyl-4,4'-diamino-1,1'-biphenyl (TPD) was evaporated at a deposition rate of 0.2 nm/sec. to a thickness of 35 nm to form a hole transporting layer. With the vacuum still kept, tris(quinolinolato) aluminum ($Alq^3$) was evaporated at a deposition rate of 0.2 nm/sec. to a thickness of 50 nm to form a light emitting and electron injecting/transporting layer. With the vacuum still kept, this EL device structure substrate was then transferred from the vacuum evaporation system to a sputtering system wherein sputtering was carried out at a sputtering pressure of 1.0 Pa to form an AlLi electron injecting electrode film (with an Li concentration of 7.2 at %) of 50 nm in thickness. In this case, Ar was used as the sputtering gas at an input power of 100 W, a target size of 4 inches in diameter and a distance of 90 mm between the substrate and the target. With the vacuum still maintained, this EL device substrate was transferred to another sputtering system wherein using an Al target, DC sputtering was carried out at a sputtering pressure of 0.3 Pa to form an Al protective electrode of 200 nm in thickness. At this time, Ar was used as the sputtering gas at an input power of 500 W, a target size of 4 inches in diameter and a distance of 90 mm between the substrate and the target.

In a dry argon atmosphere, DC voltage was applied across the obtained organic EL device to continuously drive the device at a constant current density of 10 mA/$cm^2$. In the initial stage, the device was found to emit green light of 560 cd/$m^2$ (light emission maximum wavelength λmax=530 nm) at 6.5 V. The half time of luminance was 850 hours during which an driving voltage increase of 1.5 V was observed. In this period, nowhere in the device were the occurrence and growth of dark spots of 50 µm or greater in size found.

Example 2

An organic EL device was prepared as in Example 1 with the exception that the Li concentration of the AlLi electron injecting electrode was changed to 10.6 at %.

In a dry argon atmosphere, DC voltage was applied across the obtained organic EL device to continuously drive the device at a constant current density of 10 mA/$cm^2$. In the initial stage, the device was found to emit green light of 550 cd/$m^2$ (light emission maximum wavelength λmax=530 nm) at 6.6 V. The half time of luminance was 850 hours during which an driving voltage increase of 2.0 V was observed. In this period, nowhere in the device were the occurrence and growth of dark spots of 50 µm or greater in size found.

Example 3

An organic EL device was prepared as in Example 1 with the exception that the Li concentration of the AlLi electron injecting electrode was changed to 2.3 at %.

In a dry argon atmosphere, DC voltage was applied across the obtained organic EL device to continuously drive the device at a constant current density of 10 mA/$cm^2$. In the initial stage, the device was found to emit green light of 520 cd/$m^2$ (light emission maximum wavelength λmax=530 nm) at 6.7 V. The half time of luminance was 860 hours during which an driving voltage increase of 1.1 V was observed. In this period, nowhere in the device were the occurrence and growth of dark spots of 50 µm or greater in size found.

Example 4

A device was prepared as in Example 1 with the exception that using a Ti target, DC sputtering was performed at a sputtering pressure of 0.3 Pa to form a Ti protective electrode. The device was estimated as in Example 1. Consequently, equivalent properties were obtained.

Example 5

A device was prepared as in Example 1 with the exception that $N_2$/Ar (with an $N_2$ partial pressure of 10%) was used as the sputtering gas to form a TiN protective electrode. The device was estimated as in Example 1. Consequently, equivalent properties were obtained.

Example 6

Instead of the Al protective electrode in Example 1, a protective electrode film was prepared, containing, in addition to Al, Ti, Zr, Nd, Ta, Cu, Cr, Ni and Pt each in an amount of 2 at %. The specific resistance of the resultant film was 15 $\mu\Omega$·cm for Al+Ti, 18 $\mu\Omega$·cm for Al+Zr, 14 $\mu\Omega$·cm for Al+Nd, 18 $\mu\Omega$·cm for Al+Ta, 5 $\mu\Omega$·cm for Al+Cu, 16 $\mu\Omega$·cm for Al+Cr, 9 $\mu\Omega$·cm for Al+Ni, and 11 $\mu\Omega$·cm for Al+Pt, respectively. The device was estimated as in Example 1. Consequently, substantially the same properties as in Example 1 were obtained. It was also found that when other transition metals such as Mg, Sc, Nb, Hf, Si, Mo, Mn, Pd and W were used, too, similar results were obtained.

Example 7

Organic EL devices were prepared as in Example 1 with the exception that the sputtering pressure was varied between 4.5 Pa and 0.3 Pa for the formation of electron injecting electrodes.

While the formed electron injecting electrode thin films were being ion etched, the concentration of Li therein was measured under an Auger electron microscope. Consequently, it was found that the concentration of Li was 4.6 at % at a distance ⅓ inward from the interface between the electron injecting electrode and the protective electrode, and 7.0 at % at a distance ⅔ inward from that interface. The organic EL devices were estimated as in Example 1. Substantially equivalent results were obtained.

Example 8

An organic EL device was prepared as in Example 7 with no provision of the protective electrode, and then estimated as in Example 7. Substantially similar results were obtained.

Example 9

An organic EL device was prepared as in Example 1 with the exception that a sputtering pressure of 1.0 Pa and an input power of 100 W were used with the following target composition:

Li: 8.0 at %
Al: balance
Cu: 0.50 wt %
Mg: 0.93 wt %
Zr: 0.065 wt %

It is here to be noted that the values for Cu, Mg, and Zr are given on a weight basis with respect to AlLi. The film composition of the electron injecting electrode was found to be composed of:

Li: 7.1 at %
Al: balance
Cu: 1.4 wt %
Mg: 0.87 wt %
Zr: 0.11 wt %

It is here to be noted that the values for Cu, Mg, and Zr are given on a weight basis with respect to AlLi.

DC voltage was applied across the obtained organic EL device in a dry argon atmosphere. Consequently, the organic EL device was found to have high luminance and efficiency as seen from a maximum luminance of 42000 cd/m² at 14 V and 920 mA/cm². On the other hand, DC voltage was applied across the organic EL device to continuously drive the device at a constant current density of 10 mA/cm². In the initial stage, the device was found to emit green light of 660 cd/m² (light emission maximum wavelength λmax=530 nm) at 6.6 V. The half life of luminance was 950 hours during which a driving voltage increase of 1.9 V was observed. Until the lapse of 500 hours, nowhere in the device were the occurrence and growth of dark spots of 10 $\mu$m or greater in size observed.

Example 10

A device was prepared as in Example 9 with the exception that a different target was used to obtain an electron injecting electrode having the following composition:

Li: 2.2 at %
Al: balance
Cu: 3.2 wt %
Mg: 0.12 wt %
Zr: 0.12 wt %

It is here to be noted that the values for Cu, Mg, and Zr are given on a weight basis with respect to AlLi.

The obtained organic EL device was estimated as in Example 9. In the initial stage, the device was found to emit green light (light emission maximum wavelength λmax=530 nm) of 580 cd/m² at 6.8 V. The half life of luminance was 840 hours during which a driving voltage increase of 1.1 V was observed. Until the lapse of 500 hours, nowhere in the device were the occurrence and growth of dark spots of 10 $\mu$m or greater in size observed.

Example 11

An organic EL device was prepared as in Example 1 with the exception that the thicknesses of the electron injecting electrode and protective electrode were 5 nm and 300 nm, respectively, and estimated as in Example 1. Consequently, substantially similar results were obtained.

Example 12

In Example 1, an ITO transparent electrode was patterned in a striped array at a width of 0.3 mm and an interval of 0.03 mm. Device separator structures were previously provided in such a manner that an electron injecting electrode and a protective electrode intersected at right angles with the ITO transparent electrode in a striped array at a width of 0.3 mm and an interval of 0.03 mm. Then, a metal mask was used to connect only the protective electrode to leading electrodes at ends of a substrate in such a wraparound manner as to allow it to function as an interconnecting electrode. A simple matrix display made up of 64×256 pixels was prepared in otherwise the same manner as in Example 1.

This display having a screen size of about 3.4 inches was matrix driven (Dutyl/64) under such conditions that a luminance of 100 cd/m² was obtained. Consequently, high quality yet high precision images free from light emission variations were obtained. It was found that the interconnecting electrode functioned as an interconnecting electrode of low-enough resistance, as can be seen from the fact that its film specific resistance is 3.6 $\mu\Omega$·cm. It was also found that there were neither crosstalks nor luminance drops due to leakage currents.

Example 13

In Example 1, an ITO transparent electrode was patterned in a striped array at a width of 0.3 mm and an interval of 0.03 mm. Then, a metal mask was used to connect only a protective electrode to leading electrodes at ends of a substrate in such a wraparound manner as to permit it to function as an interconnecting electrode. Film formation was subsequently carried out as in Example 12. Following this, patterning was performed using an ordinary wet process in such a way that the protective electrode and electron injecting electrode intersected at right angles with the ITO transparent ITO electrode in a striped array at a width of 0.3 mm and an interval of 0.03 mm, thereby preparing a similar display as in Example 12.

The organic EL display was driven as in Example 12. Although some defects were found probably due to penetration of solvents and solutions used in the wet process, the quality of what was displayed on the display was much the same as in Example 12.

Comparative Example 1

A device was prepared and estimated as in Example 1 with the exception that an AlLi electron injecting electrode (with Li concentration of 28 at %) was formed by vacuum co-evaporation, and an Al protective electrode was formed by vacuum evaporation under reduced pressure. In the initial stage, a luminance of 470 cd/m$^2$ was obtained at 7.4 V. The half life of luminance was 300 hours during which a driving voltage increase of 3.6 V was observed. After the lapse of 48 hours, the occurrence and growth of dark spots of 100 μm or greater in size were already observed.

Comparative Example 2

A device was prepared and estimated as in Example 1 with the exception that no Al protective electrode was formed. In the initial stage, a luminance of 550 cd/m$^2$ was obtained at 6.5 V. The half life of luminance was 650 hours during which a driving voltage increase of 1.5 V was observed. After the lapse of 250 hours, the occurrence and growth of dark spots of 100 μm or greater in size were already observed.

According to the invention, it is possible to achieve an organic EL device which comprises an electron injecting electrode that is well protected from an external environment, and improved in terms of its ability to form film at its interface with an organic layer and its adhesion to the organic layer, thereby ensuring that the organic EL device is substantially free of dark spots and has ever higher efficiency, an ever longer half life of luminance and an ever longer service life, and so can display high quality images.

It is also possible to achieve an organic EL device comprising an electron injecting electrode which is improved in terms of its ability to form film at its interface with an organic layer, its adhesion to the organic layer and its film physical properties, thereby ensuring that the organic EL device has ever higher luminance and efficiency, and so can display high quality images.

Further, it is possible to achieve an organic EL device which comprises an electron injecting electrode having film interface physical properties depending on the functions of its organic layer side surface and the opposite side surface, and which has ever higher luminance and efficiency and an ever longer service life and is insusceptible to oxidation and corrosion, and so can display high quality images.

Still further, it is possible to achieve an organic EL display which comprises an interconnecting electrode of low resistance, and can be operated at high speed with a reduced power to display high precision images.

Furthermore, it is possible to achieve an organic EL device which can reduce a current (leakage current) in the backward direction as much as possible, and so can display high quality images with neither crosstalks nor luminance variations.

Japanese Patent Application No. 145808/1997 is herein incorporated by reference.

While the invention has been described with reference to preferred embodiments, it will be obvious to those skilled in the art that various changes may be made and equivalents may be substituted for elements thereof without departing from the scope of the invention. In addition, many modifications may be made to adapt a particular situation or material to the teachings of the invention departing from the essential scope thereof. Therefore, it is intended that the invention not be limited to the particular embodiments disclosed as the best mode contemplated for carrying out the invention, but that the invention will include all embodiments falling within the scope of the appended claims.

What we claim is:

1. An organic electroluminescent light emitting device comprising a hole injecting electrode, an electron injecting electrode and at least one organic layer interleaved between said electrodes, wherein:

said electron injecting electrode is a film of an aluminum lithium alloy formed by a sputtering technique and comprising 0.4 to 14 at % of lithium, and a protective electrode comprising at least one of aluminum, aluminum and a transition metal except titanium, titanium, and titanium nitride is provided while said electron injecting electrode is positioned between said organic layer and said protective electrode.

2. An organic electroluminescent light emitting device comprising a hole injecting electrode, an electron injecting electrode and at least one organic layer interleaved between said electrodes, wherein:

said electron injecting electrode is a film of an aluminum lithium alloy formed by a sputtering technique and comprising 0.1 to 20 at % of lithium, a protective electrode comprising at least one of aluminum, aluminum and a transition metal except titanium, titanium, and titanium nitride is provided while said electron injecting electrode is positioned between said organic layer and said protective electrode, and said electron injecting electrode further includes as a subordinate component at least one of copper, magnesium, and zirconium in an amount of copper: $\leq 10$ wt % magnesium: $\leq 5$ wt % zirconium: $\leq 0.5$ wt % per a total amount thereof.

3. An organic electroluminescent light emitting device comprising a hole injecting electrode, an electron injecting electrode and at least one organic layer interleaved between said electrodes, wherein:

said electron injecting electrode is a film of an aluminum lithium alloy formed by a sputtering technique and comprising 0.1 to 20 at % of lithium, and said electron injecting electrode has a concentration gradient in such a thickness-wise direction that a large proportion of lithium is present on a side thereof contiguous to said organic layer and a small proportion of lithium is present on a side thereof contiguous to a protective electrode.

4. The organic electroluminescent light emitting device of claim 3, which further includes a protective electrode on a side of said electron injecting electrode that is not opposite to said organic layer.

5. The organic electroluminescent light emitting device of claim 4, wherein said protective electrode contains at least one of aluminum, aluminum and a transition metal except titanium, titanium, and titanium nitride.

6. The organic electroluminescent light emitting device of claim 2, wherein said electron injecting electrode contains 0.4 to 14 at % of lithium.

7. The organic electroluminescent light emitting device of claim 1, wherein said electron injecting electrode contains lithium in an amount of 0.4 at %≦Li<6.5 at %.

8. The organic electroluminescent light emitting device of claim 1, wherein said electron injecting electrode contains 6.5 to 14 at % of lithium.

9. The organic electroluminescent light emitting device of claim 1, wherein said protective electrode is formed of aluminum or aluminum and a transition metal, and functions as an interconnecting electrode.

10. A method of making an organic electroluminescent light emitting device including an electron injecting electrode, the method comprising sputtering the electron injecting electrode, and forming the organic electroluminescent light emitting device of claim 1.

11. A method of making an organic electroluminescent light emitting device including an electron injecting electrode, the method comprising sputtering the electron injecting electrode, and forming the organic electroluminescent light emitting device of claim 2.

12. A method of making an organic electroluminescent light emitting device including an electron injecting electrode, the method comprising sputtering the electron injecting electrode, and forming the organic electroluminescent light emitting device of claim 3.

* * * * *